United States Patent
Yamashiro

[11] 4,211,985
[45] Jul. 8, 1980

[54] CRYSTAL OSCILLATOR USING A CLASS B COMPLEMENTARY MIS AMPLIFIER

[75] Inventor: Osamu Yamashiro, Ohmiya, Japan
[73] Assignee: Hitachi, Ltd., Japan
[21] Appl. No.: 900,321
[22] Filed: Apr. 26, 1978

Related U.S. Application Data

[62] Division of Ser. No. 719,238, Aug. 31, 1976, Pat. No. 4,100,502.

[30] Foreign Application Priority Data

Sep. 3, 1975 [JP] Japan .................... 50-105919

[51] Int. Cl.$^2$ ............................................. H03B 5/36
[52] U.S. Cl. ................................. 331/116 FE; 331/114
[58] Field of Search ............. 331/116 R, 114, 116 FE, 331/117 FE; 330/263, 264, 269, 277; 58/23

[56] References Cited

U.S. PATENT DOCUMENTS

| | | | |
|---|---|---|---|
| 2,791,644 | 5/1957 | Sziklai | 330/13 |
| 3,676,801 | 7/1972 | Musa | 331/116 R |
| 3,760,584 | 9/1973 | Dargent | 331/116 R |
| 3,855,549 | 12/1974 | Huener et al. | 331/116 FE X |
| 3,855,552 | 12/1974 | Thanhaeuser | 331/116 R |
| 3,902,141 | 8/1975 | Berney | 331/116 FE |

Primary Examiner—Siegfried H. Grimm
Attorney, Agent, or Firm—Craig & Antonelli

[57] ABSTRACT

In oscillators such as those used in electronic watches, low power consumption is quite desirable. To accomplish this, an oscillator is provided including a complementary inverter amplifier circuit comprising a complementary inverter including a p-channel MIS FET connected to a first source potential, an n-channel MIS FET connected to a second source potential, and the gate of the two FETs being applied with a common linear input. Respective load resistors are connected to the drains of the complementary FETs, an output being derived from the interconnection point of the load resistors or from the drains of the FETs. Further, a bias resistor is connected between the gate and the drain of each of the complementary FETs, the input being supplied to the gates of the FETs through respective capacitors. The p-channel FET and n-channel FET are individually biased so that the circuit may serve as a class B push pull amplifier of low power consumption.

17 Claims, 8 Drawing Figures

VOLTAGE TRANSFER CHARACTERISTICS

CRYSTAL OSCILLATOR USING A CLASS B COMPLEMENTARY MIS AMPLIFIER

BACKGROUND OF THE INVENTION

1. Field of the Invention

This invention relates to an oscillator including an amplifier circuit, and more particularly to a complementary metal-insulator-semiconductor (C-MIS) amplifier circuit, comprising a p-channel metal-insulator-semiconductor field effect transistor (referred to as MIS FET or simply as FET, hereinbelow) and an n-channel MIS FET.

2. Description of the Prior Art

Conventionally, such a circuit as shown in FIG. 4 has been known as a crystal oscillator circuit used in an electronic wristwatch from U.S. Pat. No. 3,676,801 issued to F. H. Musa, an American publication, "RCA COS/MOS Integrated Circuits Manual" by RCA Corporation, pages 192 to 205, 1972, etc. The circuit of FIG. 4 basically comprises a C-MIS inverter circuit including an n-channel FET $M_n$ and a p-channel FET $M_p$, and a positive feedback circuit or a regenerative feedback loop connected between the input and output terminals of the inverter circuit and including a crystal oscillator X and capacitors $C_D$ and $C_G$. A resistor $R_D$ provided at the output of the amplifier circuit serves to stabilize the oscillation frequency.

Such a circuit as described above, however, has a problem that the power consumption becomes large. This can be described as follows.

When the complementary inverter amplifier circuit constituting the main part of the oscillator circuit is driven with a completely digital input signal without other components, the period during which both complementary FETs are turned on is very short and the power consumption due to the dc current passing through the two FETs causes little problem since the complementary FETs operate in a push-pull manner. When a linear (e.g., a sinusoidal) signal as shown in FIG. 5 is applied to the input terminal, however, the period during which the two FETs operate in the transfer region or in the neighborhood of the switching point (the region between the threshold voltages $V_{thn}$ and $V_{thp}$ of the FETs $M_n$ and $M_p$, i.e., the hatched region Y in FIG. 5) becomes long and the power dissipation increases.

SUMMARY OF THE INVENTION

An object of this invention is, therefore, to provide an oscillator having a complementary inverter amplifier circuit of low power consumption.

Another object of this invention is to provide an oscillator having a complementary inverter amplifier circuit accompanied with no loss current through MIS FETs which occurs due to the threshold voltage of the MIS devices in the case of amplifying a linear input.

A further object of this invention is to provide a complementary MIS inverter amplifier circuit serving as a linear amplifier means in an oscillator circuit and having an arrangement of preventing a loss or invalid current through the inverter in supplying an oscillation output to a waveform shaping MIS inverter of the following stage.

Another object of this invention is to provide a complementary MIS inverter amplifier circuit capable of monolithic integration and adapted for use in the circuit requiring low power consumption such as a micropower crystal-controlled oscillator in an electronic timepiece such as an electronic wristwatch.

Another object of this invention is to provide a complementary MIS inverter amplifier circuit having a complementary MIS inverter biased to serve as a class B push-pull amplifier for use in an oscillator.

According to one aspect of this invention, there is provided an oscillator having a complementary inverter amplifier comprising a complementary inverter including a first FET of a first conductivity type connected to a first source potential and a second FET of a second conductivity type connected to a second source potential, an input being applied commonly to the gates of the first and the second FETs, the amplifier comprising a first and a second load resistors connected in series between the first and the second FETs, bias resistors connected between the gate and the drain of the first and the second FETs, an input being supplied to the gates of the FETs through respective capacitive elements and an output being derived from the interconnection point of the first and the second load resistors or from the drains of the first and the second FETs thereby providing a class B push-pull amplifier function.

These and other objects, features and advantages of the present invention will become more apparent from the following detailed description of the invention when taken in conjunction with the companying drawings.

BRIEF DESCRIPTION OF THE DRAWINGS

Throughout the drawings, the same reference letters or characters indicate the same parts.

DESCRIPTION OF THE PREFERRED EMBODIMENTS

Figure 1:
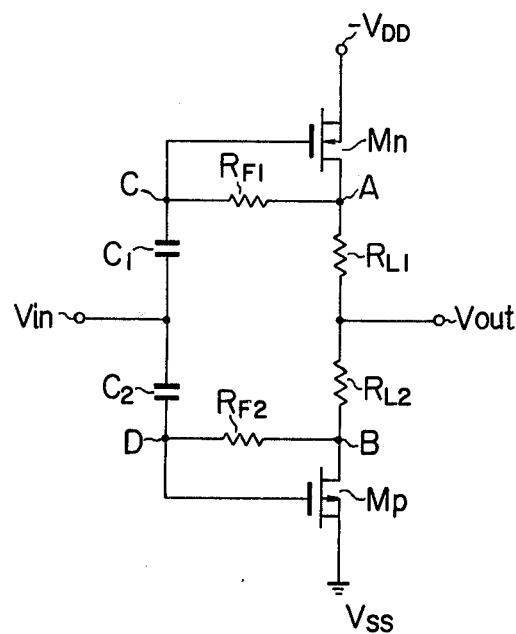
FIG. 1 is a circuit diagram of a complementary inverter amplifier according to an embodiment of this invention.

FIG. 1 shows a complementary inverter amplifier according to an embodiment of this invention, in which the circuit is arranged to operate as a class B push-pull amplifier by appropriately selecting the operational bias point of each of FETs $M_n$ and $M_p$ and to achieve reduction of the power consumption.

An n-channel enhancement mode FET $M_n$ (grounded source) connected to a potential source $-V_{DD}$ and a p-channel enhancement mode FET $M_p$ (grounded source) connected to a different potential source $V_{SS}$, ground in this example are connected in a series fashion to form a complementary inverter. Here, between the complementary FETs $M_n$ and $M_p$, two load resistors $R_{L1}$ and $R_{L2}$ of equivalent resistance are connected in series. Further, biasing resistors $R_{F1}$ and $R_{F2}$ are connected for the FETs $M_n$ between the gate and the drain thereof, respectively. The gates of the FETs $M_n$ and $M_p$ are supplied with a common input signal $V_{in}$ through respective capacitors $C_1$ and $C_2$ for ac coupling. An output $V_{out}$ of the circuit is derived from the interconnection point of the load resistors $R_{L1}$ and $R_{L2}$. Letters C, D, A and B denote the points shown in the figure, i.e., the gates and drains of the FETs. The purposes of this invention can be achieved by the above structure as will be apparent from the following description of the operation of the circuit.

Figure 2:
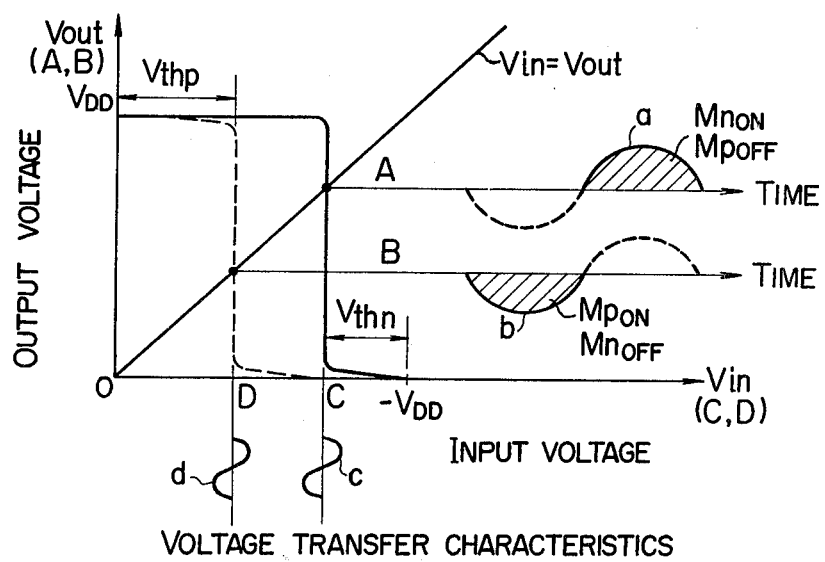
FIG. 2 shows voltage transfer characteristic curves for illustrating the operation of the circuit of FIG. 1.

In FIG. 2, the ordinate represents the output voltage of the FET and the abscissa the input voltage. The solid curve represents the relation between the voltages c and a at the gate C and the drain A of the FET $M_n$, i.e., the voltage transfer characteristic curve of the FET $M_n$, while the broken curve represents the relation between the voltages d and b at the gate D and the drain B of the FET $M_p$, i.e., the voltage transfer characteristic curve of the FET $M_p$. The biasing resistors $R_{F1}$ and $R_{F2}$ serve to equalize the dc levels of the gate and the drain voltages of the FETs $M_n$ and $M_p$, respectively. The lower the biasing resistance, the better stabilized is the biasing voltage, while the higher the biasing resistance, the higher held is the amplification factor. Considering these properties, the resistances of the biasing resistors $R_{F1}$ and $R_{F2}$ may be selected as approximately 10 megohms and may be formed of diffused resistors, polycrystalline Si resistors or on-resistances between the source and the drain of FETs. In detail, the biasing resistors $R_{F1}$ and $R_{F2}$ may be formed of on-resistances of a transmission gate of high resistance in the range of several to several tens megohms, which is formed of complementary MIS FETs to enable a monolithic integrated circuit form. The MIS FETs of the transmission gate are connected in parallel between the input and output terminals of the amplifier circuit. Here, the gate of the p-channel MIS FET is connected to the power supply voltage $-V_{DD}$ and the gate of the n-channel MIS FET to ground. Further, the higher is selected the resistance of the load resistors $R_{L1}$ and $R_{L2}$ compared to the on-resistance of the respective FETs, the steeper slope shows the voltage transfer characteristic curve and the closer the potential differential between the drain and the source (or gate-to-source) of each of the FETs $M_n$ and $M_p$ approaches the respective threshold voltage, the closer the biasing voltage approaches the threshold voltage, reducing the power consumption. Since the dc component in the input voltage $V_{in}$ is blocked by the ac coupling or dc blocking capacitors $C_1$ and $C_2$, the biasing points of the FETs $M_n$ and $M_p$ are determined separately and independently of the input signal level.

When an input signal $V_{in}$, e.g., a linear signal such as a sinusoidal wave by the oscillating operation, is applied, the voltages at the gate points as shown by C and D in FIG. 1, of the FETs $M_n$ and $M_p$ receiving the input signal through the respective capacitors $C_1$ and $C_2$ are represented by the curves c and d in FIG. 2 respectively. Then, the FETs $M_n$ and $M_p$ having operational points as described above provide amplified outputs a and b at the respective drain points as shown by A and B in FIG. 1. A total output may take the combination of these signals a and b.

Therefore, in the former half of the cycle the FET $M_p$ is turned on to generate a signal at the point B and in the latter half the FET $M_n$ is turned on the generate a signal at the point A. Namely, the output signal in the whole cycle has a waveform as shown by the hatched areas in FIG. 2. In this way, the two FETs of the complementary type take charge of the amplification in respective half cycles to totally perform the operation of a class B push-pull amplifier.

According to the above structure, the present circuit performs the class B push-pull operation and hence the period during which the two FETs are both turned on becomes short. Thus, the period of allowing a through-current to pass becomes short and the power consumption is greatly reduced.

The above analysis holds perfectly when the circuit operates ideally. In practical use, however, there remains a small possibility of momentarily allowing the turning-on of both FETs, i.e., the flow of a through-current, from the relation to the operational speed of the FETs even in the above circuit. In such a case, however, the through-current is limited in magnitude by the load resistors $R_{L1}$ and $R_{L2}$ and is almost negligible. Therefore, a complementary inverter amplifier of low power consumption is provided.

The present invention is not limited to the above embodiment and various alterations and modifications would be possible.

Figure 3:
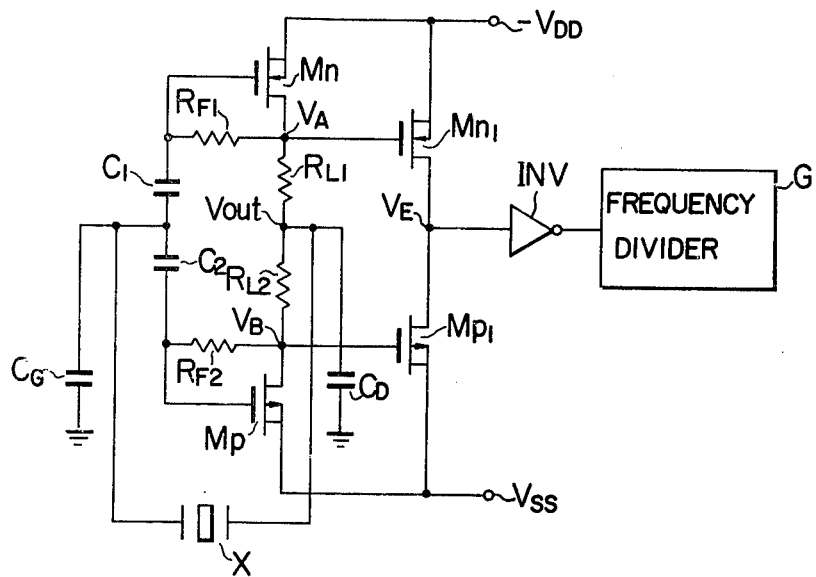
FIG. 3 is a circuit diagram of an oscillator circuit including an embodiment of the amplifier circuit according to this invention.
Figure 4:
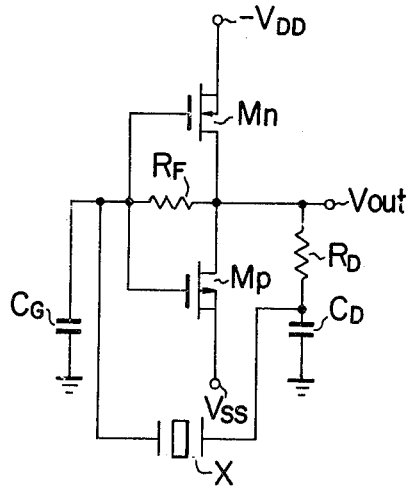
FIG. 4 is a circuit diagram of a conventional oscillator circuit.
Figure 5:
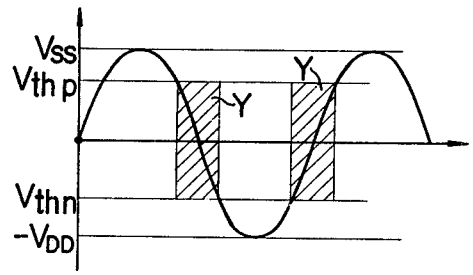
FIG. 5 is a graph for illustrating the reason for allowing a loss through-current in the conventional circuit of FIG. 4.

For example, the output of the above complementary amplifier is derived from the interconnection of the load resistors $R_{L1}$ and $R_{L2}$ connected in series between the conduction paths of the two FETs $M_n$ and $M_p$ in the above embodiment, but it may be replaced by those derived from the respective drains of the two FETs according to the use or purposes. An example of such a case is shown in FIG. 3 in which the inverter amplifier is used in an oscillator circuit.

fig. 3 shows a crystal-controlled oscillator circuit for use in an electronic wristwatch. The complementary inverter circuit according to an embodiment of this invention is used as the amplifier means and a positive feed-back circuit including a crystal oscillator X and capacitors $C_D$ and $C_G$ is connected between the input and output terminals of the amplifier. Generally, an output signal $V_{out}$ of this oscillator circuit is supplied to a frequency divider circuit through a waveform shaping inverter which is also called a logic circuit. Here, the following problem arises.

Since the load resistors $R_{L1}$ and $R_{L2}$ are provided in the complementary inverter of the oscillator circuit, the output $V_{out}$ of the oscillator resembles a sinusoidal wave. Therefore, if such a sinusoidal wave is directly applied to an inverter of the next circuit stage, a through-current is allowed to pass through the inverter for a long period to increase the power consumption.

Therefore, in the circuit of FIG. 3, the voltages $V_A$ and $V_B$ at the respective drains of the FETs $M_n$ and $M_p$ are derived as the outputs of the complementary amplifier and are applied to the gates of an n-channel FET $M_{n1}$ and a p-channel FET $M_{p1}$ of a complementary inverter, respectively, whose drain electrodes are connected in common to constitute an output terminal $V_E$. The source electrodes of the FETs $M_{n1}$ and $M_{p1}$ are connected to the operating potential sources $-V_{DD}$ and $V_{SS}$ respectively. The output of the complementary inverter is then supplied to a frequency divider G through a waveform shaping inverter INV. In this arrangement, two amplified output signals $V_A$ and $V_B$ are supplied to the gates of the corresponding FETs $M_{n1}$ and $M_{p1}$ of the complementary inverter in the next circuit stage. Then, since no load resistor is used in this complementary inverter, a square wave is provided at an output terminal $V_E$. Hence, the through-current in the waveform shaping inverter INV is minimized and an oscillator circuit of low power operation is provided.

Figure 6:
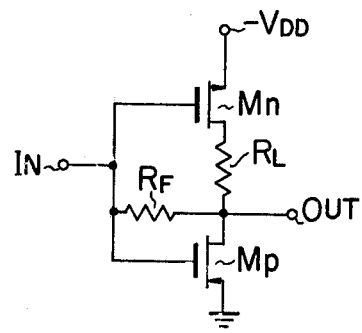
FIG. 6 is a circuit diagram of a complementary MIS FET amplifier according to another embodiment of this invention.

FIG. 6 shows a complementary MIS amplifier circuit according to another embodiment of this invention, in which an n-channel MIS FET $M_N$ and a p-channel MIS FET $M_p$ are connected in series between two operating voltage terminals, one at $-V_{DD}$ and the other at a reference level, e.g., ground. A resistor $R_L$ is connected between the drains of the MIS FETs $M_N$ and $M_P$ to suitably limit a current passing through the conduction paths of these FETs. A biasing resistor $R_F$ is coupled between an input terminal IN and an output terminal OUT of the amplifier. The bias point for the MIS FET $M_P$ which is set at a potential in the neighborhood of the threshold voltage $V_{th}$ of the MIS FET $M_P$ is shown by way of example. The gates of the complementary MIS FETs $M_N$ and $M_P$ are commonly in ac sense connected to the input terminal IN. Output deriving points and linear biasing of the circuit may be selected in various manner according to the need of the designer, for example, as shown in FIG. 1 or FIG. 3.

In this circuit, since the conduction current limiting resistor $R_L$ is provided in the drain side of the amplifier FET but not in the source side, a feed-back loop as in the latter case is not formed, so that the amplifier circuit can achieve low power consumption without substantially lowering its amplification, and also, the dispersion or variation in the amplification of the amplifier due to the manufacturing dispersion of the resistance of the resistor $R_L$ becomes small. Further, since the MIS FET $M_P$ is based to operate as class B amplifier, low power dissipation is successfully achieved.

Figure 7:
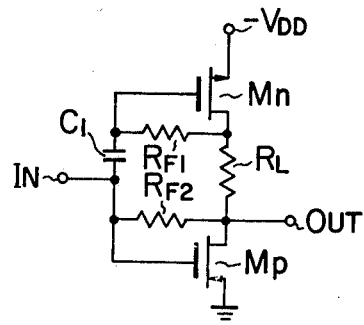
FIG. 7 is a circuit diagram illustrating a modification of FIG. 1.

FIG. 7 illustrates a modified circuit of FIG. 6 but similar to FIG. 1, in which no ac coupling capacitor is provided between the input terminal IN and the MIS FET $M_P$ and instead, this transistor is biased directly by the biasing resistor $R_{F2}$. Consequently, no attenuation of an ac input signal due to the ac coupling capacitor, which will be applied to the MIS FET $M_P$ will occur. Also, since the number of circuit components is reduced compared with the circuit of FIG. 1, it is advantageous to produce the circuit in an IC chip. The output terminal OUT may be provided at the drain of the MIS FET $M_N$.

Figure 8:
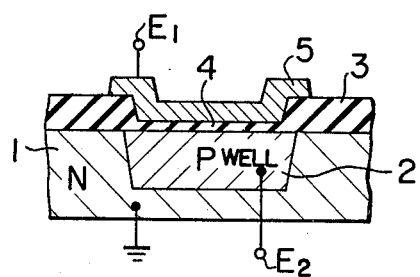
FIG. 8 is a sectional view of an MIS capacitor illustrating an ac coupling capacitor used in the present amplifier.

Capacitors for ac coupling capacitors $C_1$ and $C_2$ may be integrated in an MIS integrated circuit. Namely, an MIS capacitor for the capacitor $C_1$ or $C_2$ may be formed as shown in FIG. 8 using a so-called silicon-gate MOS process by which other transistors are fabricated in the same chip. In the MIS capacitive structure, a p-type semiconductor well region 2 is formed in an n-type semiconductor substrate 1 grounded to constitute one electrode of the capacitor. A silicon dioxide layer 3 is formed over the surface of the semiconductor substrate. On the surface of the well region 2 a thin silicon dioxide film 4 is formed, on which a polycrystalline silicon layer 5 is provided to constitute the other electrode of the capacitor. The electrode layer 5 is led to a terminal $E_1$. A p+-type diffused region (not shown) is formed in the p-type well region 2 from which another terminal $E_2$ is formed through the silicon dioxide layer 3. Thus, the capacitor is formed of an MOS capacitance established between the p-type well region and the polycrystalline silicon layer 5, and is isolated from ground. The leadout p+-type region is diffused in the well region 2 simultaneously with the step of diffusing source and drain regions for other MIS elements.

It will be apparent that in the amplifier circuits described above, the polarities of the FETs may be reversed with the inversion of the polarity of the power source potentials.

Further, any circuits and/or circuits elements may be added to the basic circuit structures of the above embodiments for operating the circuit more effectively.

This invention can be widely utilized as an amplifier circuit of low power consumption adapted for monolithic integration.

What we claim is:

1. An oscillator circuit including an amplifier means using a complementary MIS inverter circuit and a positive feed-back means connected between the input and the output of said amplifier means for feeding back the output signal of said amplifier means to the input thereof and including an inductive element and capacitance elements provided at the input and the output of said amplifier means, the inverter circuit of said amplifier means including a p-channel and n-channel FETs, a first resistance means connected between the drains of said FETs, second resistance means connected between the drain and gate of said p-channel FET, and third resistance means connected between the drain and gate of said n-channel FET, whereby the bias voltage between the gate and the source of each of said p-channel and n-channel FETs is set to a predetermined voltage.

2. The oscillator circuit according to claim 1, in which said p-channel and n-channel FETs have dc bias points different from each other.

3. The oscillator circuit according to claim 2, in which the gates of said p-channel and n-channel FETs are connected in common through respective capacitors.

4. The oscillator circuit according to claim 1, in which the gate of each of said p-channel and n-channel FETs is biased at a dc potential nearly equal to its drain potential.

5. The oscillator circuit according to claim 4, in which the gates of said p-channel and n-channel FETs are connected in common through respective capacitors.

6. The oscillator circuit according to claim 1, in which the bias potential between the gate and the source of each of said p-channel and n-channel FETs is nearly equal to its threshold voltage.

7. The oscillator circuit according to claim 6, in which the gates of said p-channel and n-channel FETs are connected in common through respective capacitors.

8. The oscillator circuit according to claim 1, in which said positive feed-back means comprises a crystal and a first and a second capacitor connected at both ends of said crystal, respectively.

9. An oscillation circuit comprising:
first and second operating potential terminals;
a push-pull amplifier stage comprising input and output terminals, a first p-channel and a first n-channel FET,
a pair of coupling capacitors each connected between said input terminal and the gate of said each FET,
a pair of bias resistors each connected between the gate and the drain of said each FET for biasing the gate at a dc level nearly equal to its drain potential, and a pair of load resistors each connected between the drain of said each FET and said output terminal;

a positive feedback circuit comprising first and second capacitors having each one end grounded and each other end connected to said input and output terminals of said amplifier stage, respectively, and a crystal coupled therebetween;

a waveform shaping stage for clipping a signal comprising a second p-channel FET and a second n-channel FET, the gates of which are connected to the drains of said first p-channel and n-channel FETs respectively and the drains of which are connected in common; and an output terminal of said oscillation circuit connected to the commonly connected drains of said second p-channel and n-channel FETs, the sources of said first and second p-channel FETs being connected to said first operating potential terminal and the sources of said first and second n-channel FETs being connected to said second operating potential terminal.

10. The oscillator circuit according to claim 9, in which the potential difference between the source and the drain of each of said first p-channel and n-channel FETs is set at a potential nearly equal to its threshold voltage.

11. An oscillator comprising in combination:

first and second operating voltage terminals;

first and second field effect transistors of complementary conductivity types, each having a conduction path and a control electrode for controlling the conductivity of said conduction path, said control electrode connected through a capacitor to an input terminal, said conduction paths connected in series between said operating voltage terminals;

first and second load resistors for said first and second transistors, respectively, connected in series between said conduction paths, the connection between said load resistors serving as an output terminal;

first and second bias resistors provided for said first and second transistors, respectively, for controlling the operation points of the input signal at said control electrodes in cooperation with said first and second load resistors, each of said first and second bias resistors being connected between the control electrode and one end of said conduction path, which is on the side connected to said load resistor, in each of said first and second transistors; and a regenerative feedback path comprising a crystal connected between said output and input terminals.

12. The oscillator according to claim 11, further comprising third and fourth field effect transistors of complementary conductivity types, each having a conduction path and a control electrode for controlling the conductivity of said conduction path, said control electrodes of the third and fourth transistors being connected to the interconnection between said load resistor and the conduction path of the corresponding one of said first and second transistors, said conduction paths of said third and fourth transistors being connected in series between said operating voltage terminals, the connection between the conduction paths of said third and fourth transistors serving as an output terminal of the oscillator.

13. An oscillation circuit comprising:

a push-pull amplifier comprising a series circuit of p-channel and n-channel FETs, the drains of said FETs being connected to each other through load resistive means, the gate of each of said FETs being connected to the drain thereof through bias resistive means so that said bias resistive means causes the bias voltage between the gate and the source thereof to be set at a predetermined voltage in cooperation with said load resistive means, output means coupled to said drains of said FETs for deriving an a.c. output signal, and input means coupled to the gates of said FETs for applying an a.c. input signal; and positive feed-back means connected between said input means and said output means for feeding back the output signal of said amplifier to said input means of said amplifier.

14. The oscillation circuit according to claim 13, further comprising a succeeding amplifier including a series circuit of p-channel and n-channel FETs, the drains of which are connected to in common while the gate of each of which is connected to the drain of a respective corresponding channel type FET of said push-pull amplifier.

15. In an electronic watch using a crystal-controlled oscillation circuit, said oscillation circuit comprising:

a push-pull amplifier comprising a series circuit of p-channel and n-channel FETs, the drains of said FETs being connected to each other through load resistive means, the gate of each of said FETs being connected to the drain thereof through bias resistive means so that said bias resistive means causes the bias voltage between the gate and the source thereof to be set at a predetermined voltage in cooperation with said load resistive means, output means coupled to said drain of said FETs for deriving an a.c. output signal, and input means coupled to the gates of said FETs for applying an a.c. input signal; and positive feed-back means connected between said input means and said output means for feeding back the output signal of said amplifier to said input means of said amplifier, said positive feed-back means including first and second capacitors connected at said input and output means respectively, and a crystal coupled therebetween.

16. An oscillator circuit comprising a first series circuit of first p-channel and n-channel FETs connected between a pair of power source terminals, and a second series circuit of second p-channel and n-channel FETs connected between said power source terminals, said first series circuit including resistive connection means for connecting the drain of said first p-channel FET to the drain of said first n-channel FET and bias means for applying to the gate of each of said first p-channel and n-channel FETs from the drain thereof a bias voltage substantially equal to the drain d.c. potential, and said second series circuit including first connecting means for connecting the drains of said second p-channel and n-channel FETs in common, and second connecting means for connecting the gates of said second p-channel and n-channel FETs to the drains of said first p-channel and n-channel FETs respectively, thereby causing respective bias points of said second p-channel and n-channel FETs to be substantially equal to those of said first p-channel and n-channel FETs, respectively, and positive feedback means connected between said resistive connection means and the gates of said first p-channel and n-channel FETs.

17. An oscillator circuit according to claim 16, wherein said positive feed-back means includes a crystal and a pair of capacitors.

* * * * *